United States Patent [19]
Uenishi

[11] Patent Number: 5,408,117
[45] Date of Patent: * Apr. 18, 1995

[54] SEMICONDUCTOR DEVICE AND METHOD OF FABRICATING THE SAME

[75] Inventor: Akio Uenishi, Itami, Japan

[73] Assignee: Mitsubishi Denki Kabushiki Kaisha, Tokyo, Japan

[*] Notice: The portion of the term of this patent subsequent to Apr. 16, 2008 has been disclaimed.

[21] Appl. No.: 953,301

[22] Filed: Sep. 28, 1992

Related U.S. Application Data

[60] Continuation of Ser. No. 635,877, Dec. 26, 1990, abandoned, Division of Ser. No. 460,007, Jan. 2, 1990, Pat. No. 5,008,720.

[30] Foreign Application Priority Data

Apr. 21, 1989 [JP] Japan .................. 1-102702

[51] Int. Cl.[6] ............... H01L 29/10; H01L 29/34
[52] U.S. Cl. .................... 257/339; 257/345; 257/378; 257/341
[58] Field of Search ............ 257/339, 345, 378, 341, 257/139, 491

[56] References Cited

U.S. PATENT DOCUMENTS

| | | | |
|---|---|---|---|
| 4,466,176 | 8/1984 | Temple | 148/187 |
| 4,503,598 | 3/1985 | Vora et al. | 357/23.4 |
| 4,672,407 | 6/1987 | Nakagawa et al. | 357/23.4 |
| 4,757,032 | 7/1988 | Contiero | 437/162 |
| 4,798,810 | 1/1989 | Blanchard et al. | 457/154 |
| 4,803,532 | 2/1989 | Mihara | 357/23.4 |
| 4,810,665 | 3/1989 | Chang et al. | 437/30 |
| 4,855,799 | 8/1989 | Tanabe et al. | 357/23.4 |
| 4,896,196 | 1/1990 | Blanchard et al. | 357/23.4 |
| 4,902,636 | 2/1990 | Akiyama et al. | 148/DIG. 126 |
| 4,965,647 | 10/1990 | Takahashi | 357/23.4 |
| 5,008,720 | 4/1991 | Uenishi | 257/339 |

OTHER PUBLICATIONS

Ghandhi "VLSI Fabrication Principles", 1983 by John Wiley and Sons, Inc. New York, p. 317.
IEEE Electron Device Letters, vol. EDL-4, No. 3, Mar. 1983, pp. 63-65, J. P. Russell, et al., "The COM-FET-A New High Conductance MOS-Gated Device".
Solid State Electronics, vol. 29, No. 12, 1986, pp. 1229-1237, DI-SON KUO, et al., "An Analytical Model for the Power Bipolar-MOS Transistor".
IEEE Transactions on Power Electronics, vol. PE-2, No. 2, Apr. 1987, pp. 136-142, D. L. Blackburn, "Turn-Off Failure of Power MOSFET's".

Primary Examiner—Jerome Jackson
Assistant Examiner—D. Monin
Attorney, Agent, or Firm—Oblon, Spivak, McClelland, Maier & Neustadt

[57] ABSTRACT

A semiconductor device comprises a first conductivity type semiconductor layer and a second conductivity type well region which is formed on the semiconductor layer. The well region includes a first semiconductor region of a first depth and a second semiconductor region of a second depth deeper than the first depth which is provided in the central portion of the first semiconductor region. The ratio of the first depth to the second depth is settled in a range from 0.85 to 0.95 in order to increase the breakdown voltage of the semiconductor device.

3 Claims, 10 Drawing Sheets

SEMICONDUCTOR DEVICE AND METHOD OF FABRICATING THE SAME

This application is a continuation of application Ser. No. 07/635,877, filed on Dec. 26, 1990, now abandoned which was a Rule 60 Divisional Application of prior application Ser. No. 07/460,007, filed on Jan. 2, 1990, now U.S. Pat. No. 5,008,720.

BACKGROUND OF THE INVENTION

1. Field of the Invention

The present invention relates to a semiconductor device and a method of fabricating the same and, more particularly, it relates to a semiconductor device such as a power MOSFET and IGBT (Insulated gate bipolar transistor) with increased breakdown voltage and a method of fabricating the same.

2. Description of the Background Art

Figure 1:
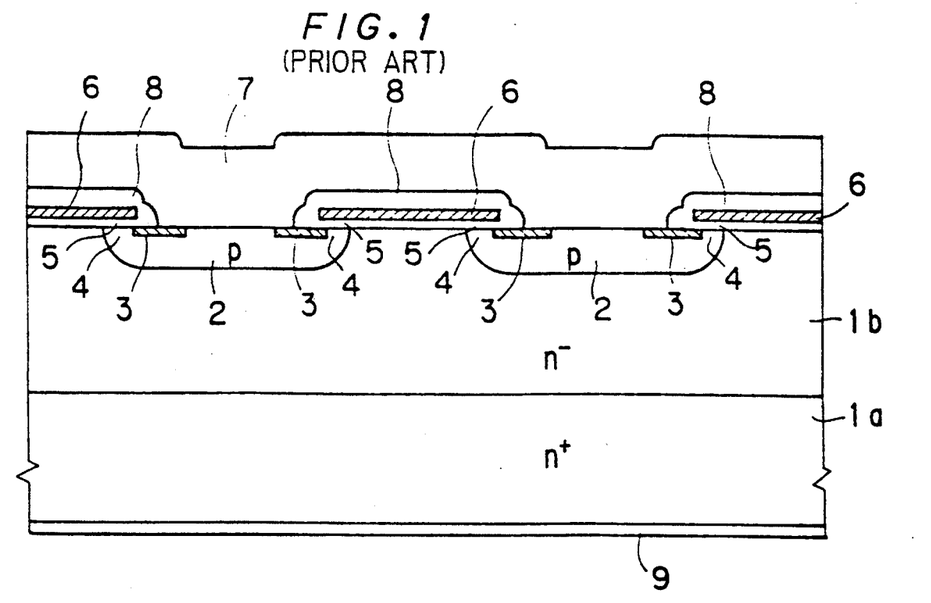
FIG. 1 is a sectional view of a conventional semiconductor device.

FIG. 1 is a sectional view showing a plurality of basic MOS unit cells of a conventional n channel power MOSFET device.

Referring to FIG. 1, an n⁻ drain region 1b is superposed on the upper surface of an n+ drain region 1a. A plurality of separate p semiconductor regions 2 are selectively formed in the surface of the n⁻ drain region 1b. N+ source regions 3 are selectively formed in the surfaces of the p semiconductor regions 2, each of which is spaced by a predetermined interval from the n⁻ drain region 1b. Channel regions 4 are defined near portions of the surfaces of the p semiconductor regions 2 between the n+ source regions 3 and the n⁻ drain region 1b. Gate insulation films 5 are formed on the channel regions 4, and gate electrodes 6 are superposed thereon. Further, a source electrode 7 is formed to connect and short-circuit the central portions of the surfaces of the p semiconductor regions 2 and parts of the surfaces of the n+ source regions 3. The gate electrodes 6 and the source electrode 7 are electrically isolated by layer insulation films 8 interposed therebetween. A drain electrode 9 is formed on the bottom surface of the n+ drain region 1a.

An operation of the conventional semiconductor device in FIG. 1 will now be described. A drain voltage V$_{DS}$ is applied across the drain electrode 9 and the source electrode 7. When a gate voltage V$_{GS}$ is applied across the gate electrodes 6 and the source electrode 7, inversion layers are formed in the channel regions 4. A drain current I$_D$ flows between the drain electrode 9 and the source electrode 7 through the channel regions 4. The drain current I$_D$ is controlled by the gate voltage V$_{GS}$. A potential at the channel regions 4 are fixed by connecting and short-circuiting the central poritons of the surfaces of the p semiconductor regions 2 and the parts of the surfaces of the n+ source regions 3 with the source electrode 7.

Figure 2:
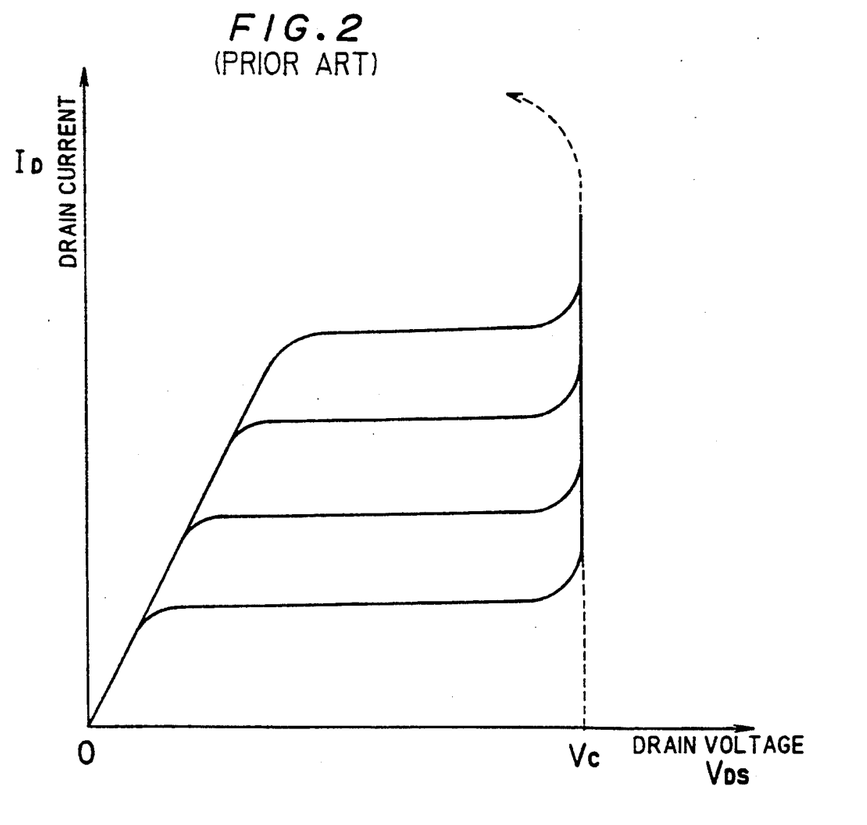
FIG. 2 is a graph illustrating an output characteristic of the semiconductor device shown in FIG. 1.

The power MOSFET is liable to break down in such a manner as will be described below. FIG. 2 is a graph illustrating an output characteristic of the power MOSFET shown in FIG. 1. The axis of ordinate of the graph represents the drain current I$_D$ and the axis of abscissa represents the drain voltage V$_{DS}$. A parameter is the gate voltage V$_{GS}$. When the drain voltage V$_{DS}$ reaches the breakdown voltage V$_C$, the drain current I$_D$ rapidly increases to cause the breakdown state of the power MOSFET device. The power MOSFET device tends to be instantaneously destroyed when the breakdown current J$_C$ becomes large to the extent of exceeding a certain critical value.

Figure 3A:
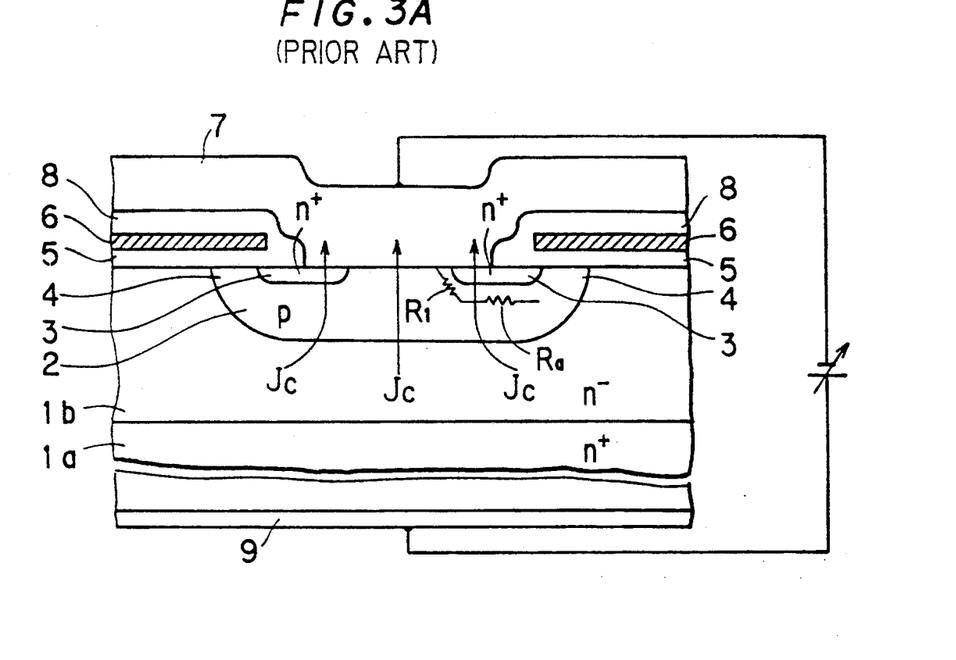
FIGS. 3A and 3B are diagrams for explaining the problems with the semiconductor device shown in FIG. 1.
Figure 3B:
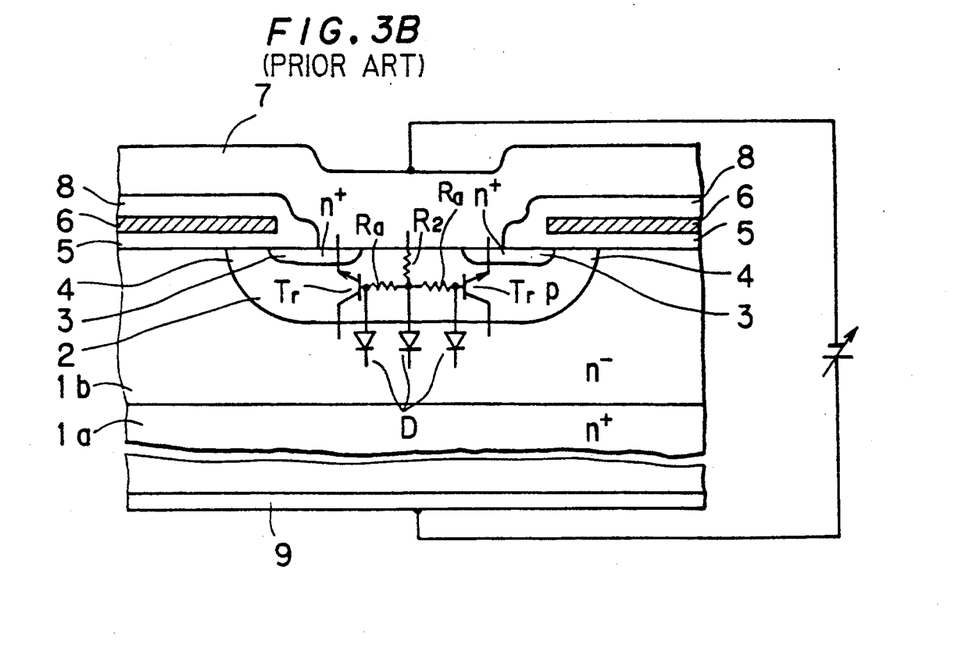

FIG. 3A is a schematic sectional view showing a power MOSFET and FIG. 3B is a similar schematic sectional view of the power MOSFET to which a diagram of its equivalent circuit is superposed. Referring to FIG. 3A, there are internal resistances R$_1$ and R$_a$ near the respective n+ source regions 3 in the p semiconductor region 2. The internal resistance R$_1$ extends in a direction corresponding to the depth of each n+ source region 3 while the internal resistance R$_a$ extends in a direction along the bottom surface of each n+ source region 3. In FIG. 3B, these internal resistances are replaced with a composite internal resistance R$_2$ extending in a direction corresponding to the depth of the n+ source regions 3 and the internal resistances R$_a$ extending in a direction along the bottom surfaces of the n+ source regions 3 in the p semiconductor region 2. The internal resistances R$_a$ serve as a base resistance of a parasitic transistor T$_r$ composed of the n⁻ drain region 1b, the p semiconductor region 2 and the n+ source regions 3. The n⁻ drain region 1b and the p semiconductor region 2 form a diode D.

When the drain voltage V$_{DS}$ applied across the source electrode 7 and the drain electrode 9 is increased and reaches the breakdown voltage of the diode D defined by the n⁻ drain region 1b and the p semiconductor region 2, the breakdown current J$_C$ begins to flow as indicated with arrows in FIG. 3A. When the breakdown current J$_C$ flows just under the bottom surfaces of the n+ source regions 3, the base potential of the parasitic transistor T$_r$ rises. The parasitic transistor T$_r$ becomes conductive when the potential difference between the base and the emitter becomes more than 0.6V. This condition is given by the following equation:

$$J_C \times R_a > 0.6 \text{ (V)} \tag{1}$$

It should be noted that the composite internal resistance R$_2$ extending in the direction corresponding to the depth of the n+ source regions 3 is sufficiently smaller than the internal resistances R$_a$ and therefore it is negligible. When the breakdown current J$_C$ which satisfies the equation (1) flows into the transistor T$_r$, it becomes conductive.

At this time, the collector current flowing in the parasitic transistor T$_r$ is equal to the product of the base current and a direct current amplification factor h$_{FE}$ of the parasitic transistor T$_r$. Usually, the value of the direct current amplification factor h$_{FE}$ is very large, and hence the collector current flowing in the parasitic transistor T$_r$ is also very large. Thus, when a breakdown voltage is lower in some part than in other parts, no matter how slight the difference may be, the flow of current concentrates in such area, ultimately resulting in breaking down the power MOSFET.

A conventional semiconductor device such as a power MOSFET structured as has been described has an insufficient to breakdown voltage, and therefore it tends to be instantaneously destroyed due to overload.

SUMMARY OF THE INVENTION

A semiconductor device in accordance with the present invention comprises a first conductivity type semiconductor layer and a second conductivity type well region formed on the semiconductor layer. The well region has a first semiconductor region of a first depth and a second semiconductor region of a second depth deeper than the first depth which is provided in a central portion of the first semiconductor region. A ratio of the first depth to the second depth is selected in a range from 0.85 to 0.95.

A method of fabricating a semiconductor device in accordance with the present invention comprises the steps of preparing a first conductivity type semiconductor layer having first and second major surfaces, forming a second conductivity type well region selectively in the first major surface of the semiconductor layer by double diffusion, the well region having a stepped configuration composed of a peripheral portion of a first depth and a central portion of a second depth deeper than the first depth, a ratio of the first depth to the second depth ranging from 0.85 to 0.95, forming a first conductivity type semiconductor region selectively in a surface of the well region, forming a first main electrode on the semiconductor region, and forming a second main electrode on the second major surface of the semiconductor layer. The step of forming a second conductivity type well region includes the step of forming a mask for the double diffusion which includes the steps of forming a patterned insulation layer on the first major surface of the semiconductor layer and forming a patterned control electrode on the insulation layer.

According to the present invention, a well region is formed by a first semiconductor region having a first relatively shallow depth and a second semiconductor region having a second relatively deep depth which is provided in the center of the first semiconductor region in a manner that the ratio of the first depth to the second depth ranges from 0.85 to 0.95. Consequently, a semiconductor device which can not be easily broken down due to overload and has a high breakdown voltage can be implemented.

Accordingly, it is an object of the present invention to provide a semiconductor device which can not be easily broken down due to overload and has a high breakdown voltage.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 4:
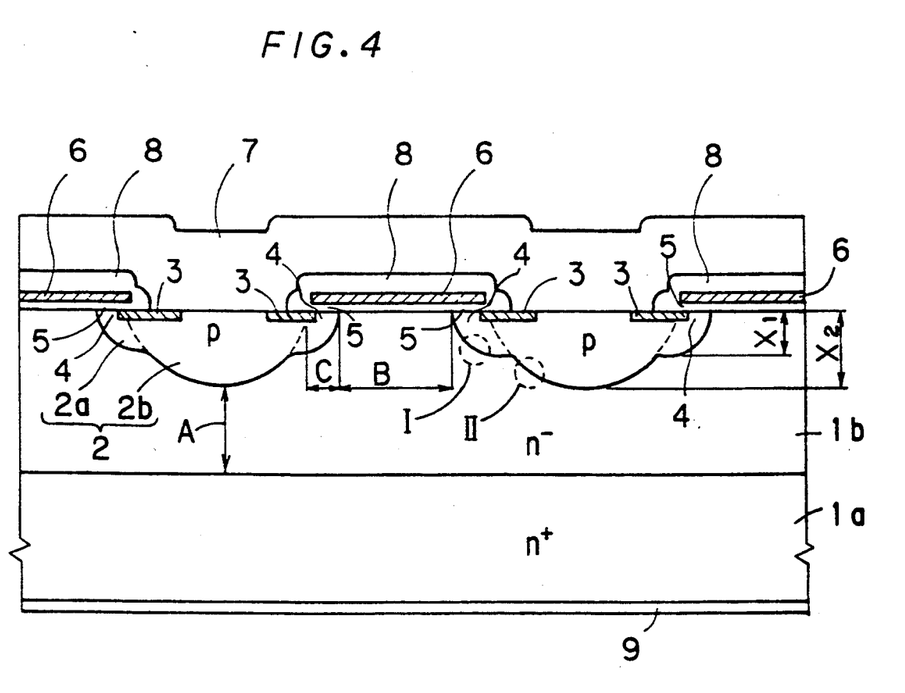
FIG. 4 is a sectional view shownning an embodiment of a semiconductor device according to the present invention.

FIG. 4 is a sectional view showing a basic MOS unit cell of an n channel power MOSFET which is an embodiment of a semiconductor device according to the present invention. In this embodiment, a p semiconductor (well) region 2 is composed of a relatively shallow first semiconductor region 2a and a relatively deep second semiconductor region 2b provided in the center of the first semiconductor region 2a. The second semiconductor region 2b is provided for forcing the breakdown current $J_C$ to flow only in this part.

Other structures of this power MOSFET are the same as those in the above mentioned conventional power MOSFET. That is, an $n^-$ drain region 1b is formed on an $n^+$ drain region 1a. A plurality of the separate p semiconductor regions 2 composed of the first and second semiconductor regions 2a, 2b are selectively provided in the surface of the $n^-$ drain region 1b. In the surfaces of the p semiconductor regions 2, $n^+$ source regions 3 are selectively formed at predetermined intervals from the $n^-$ drain region 1b. The $n^+$ source regions 3, for example, may be annular. Channel regions 4 are defined in the vicinity of the surfaces of the p semiconductor regions 2 between the surfaces of the annular $n^+$ source regions 3 and the $n^-$ drain region 1b. Gate insulation films 5 are formed on the channel regions 4 and gate electrodes 6 are superposed thereon. Additionally, a source electrode 7 is formed in common with all the unit cells to connect and short-circuit the central portions of the surfaces of the p semiconductor regions 2 and parts of the surfaces of the $n^+$ source regions 3. The gate electrodes 6 and the source electrode 7 are electrically isolated by layer insulation films 8 interposed therebetween. A drain electrode 9 is formed on the rear surface of the $n^+$ drain region 1a.

The basic operation of this n channel power MOSFET is the same as that of the aforementioned conventional power MOSFET as well be described below. A drain voltage $V_{DS}$ is applied across the drain electrode 9 and the source electrode 7. When a gate voltage $V_{GS}$ is applied across the gate electrodes 6 and the source electrode 7, inversion layers are formed in the channel regions 4, so that drain current $I_D$ flows between the drain electrode 9 and the source electrode 7 through the channel regions 4. The drain current $I_D$ is controlled by the gate voltage $V_{GS}$. A potential at the channel regions 4 is fixed by connecting and short-circuiting the central portions of the surfaces of the p semiconductor regions 2 and parts of the surfaces of the $n^+$ source regions 3 with the source electrode 7.

Now, the manufacturing steps of this n channel power MOSFET will be described. FIGS. 5A to 5E are sectional views illustrating an example of a method for manufacturing the n channel power MOSFET shown in FIG. 4.

Figure 5A:
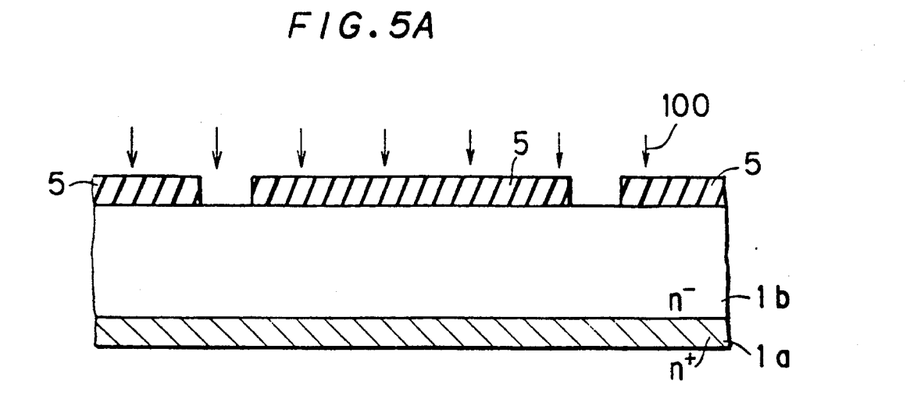
FIGS. 5A to 5E are sectional views illustrating manufacturing steps of the semiconductor device shown in FIG. 4.
Figure 5B:
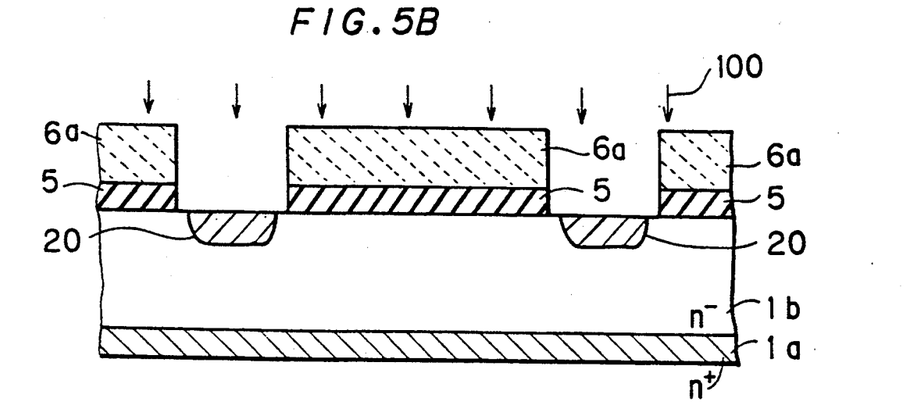

Referring to FIG. 5A, the $n^-$ drain region 1b is deposited on the $n^+$ drain region 1a by means of epitaxial growing. An oxide film is deposited on the $n^-$ drain region 1b and patterned by means of photolithography to form the gate oxide films 5. A p type impurity 100 such as boron is injected to the $n^-$ drain region 1b through a mask of the gate oxide films 5 by means of ion implantation. After that, a heat treatment at approximately 1200° C. for a specific period of time causes the p type impurity 100 to diffuse up to several $\mu$m in depth so that p semiconductor regions 20 are formed as shown in FIG. 5B.

Figure 5C:
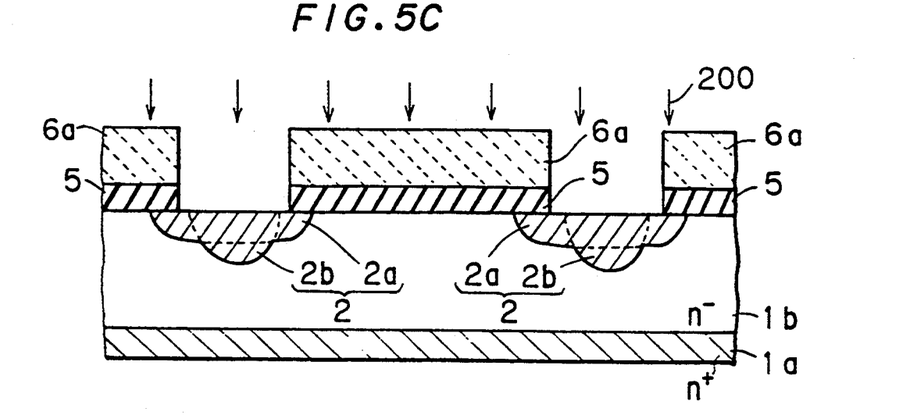

Then, polysilicon 6a is deposited and thereafter both the polysilicon 6a and the gate oxide films 5 are patterned by means of photolithography so as to open windows therein which are larger than those patterned in the course of the previous step. The p type impurity 100 is injected again to the n⁻ drain region 1b through a mask of the polysilicon 6a by means of ion implantation. After that, the p semiconductor regions 2 each of which is composed of the relatively shallow first semiconductor region 2a and the relatively deep second semiconductor region 2b provided in the center portion of the first semiconductor region 2a are formed by means of a heat treatment at approximately 1200° C. for a specific period of time, as shown in FIG. 5C. Adjusting a time period for annealing after ion implantation in each step can vary depth of these semiconductor regions 2a and 2b.

Figure 5D:
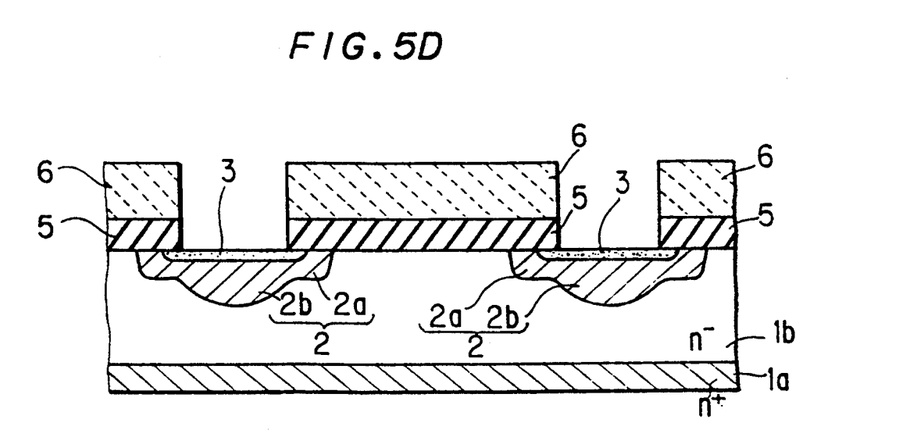

An n type impurity 200 such as phosphorus is deposited to the p semiconductor regions 2 through the mask of the polysilicon 6a, and thereafter the shallow n⁺ source regions 3 are formed by means of a heat treatment at 900° C. for a specific period of time. Upon formation of these regions 3, an n type impurity 200 such as phosphorus comes into the polysilicon 6a and thus the ploysilicon 6a, being thereby conductive, is developed into the gate electrode 6 as shown in FIG. 5D.

Figure 5E:
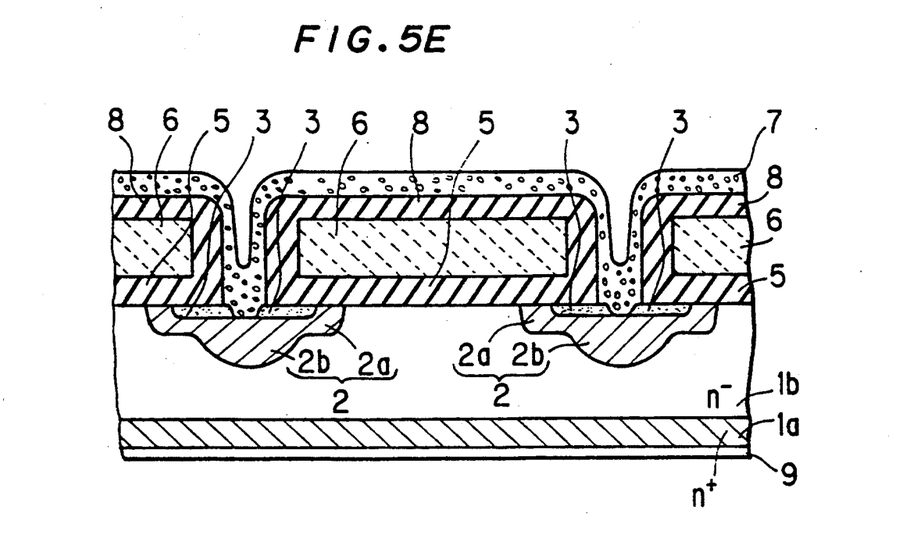

Referring to FIG. 5E, an oxide film is deposited and then holes are made in contact portions by means of photolithography to form the layer insulation films 8. After parts of n⁺ source regions 3 are eliminated by etching, the source electrode 7 is formed by depositing aluminum on the layer insulation films 8 and openings therein. Further, the drain electrode 9 is formed on the rear surface of the n⁺ drain region 1a.

This power MOSFET has an increased breakdown voltage as will be described below. Each p semiconductor (well) region 2 of this power MOSFET is formed by the relatively shallow first semiconductor region 2a and the relatively deep second semiconductor region 2b provided in the center portion of the first semiconductor region 2a, so that the flow of the breakdown current $J_C$ concentrates in the relatively deep second semiconductor regions 2b, especially near the center portion in the second semiconductor regions 2b. As a result, since the current flowing just under the n⁺ source regions 3 is reduced, a parasitic transistor $T_r$ can not be easily activated, or its collector current becomes sufficiently small even when it is activated. The paratstic transistor $T_r$, which cannot be thus easily triggered, does not cause a breakdown easily even in the case of overload.

The flow of the breakdown current $J_C$ concentrates in the relatively deep second semiconductor regions 2b for the following reasons. As has been described, the second semiconductor regions 2b are formed by means of thermal diffusion. Then, the bottom surfaces of the second semiconductor regions 2b are somewhat spherical but not entirely flat as shown in FIG. 4. Accordingly, the radius of curvature of each depletion layer extending from the boundary between the n⁻ drain region 1b and each p semiconductor region 2 in applying the drain voltage $V_{DS}$ across the source electrode 7 and the drain electrode 9 is smaller in a part corresponding to each P bottom surface of the second semiconductor region 2b compared with the case in which no second semiconductor region 2b is provided. As a result, electric field is liable to concentrate, i.e., become strong in the bottom surfaces of the second semiconductor regions 2b, so that the flow of the breakdown current $J_C$ concentrates in the second semiconductor regions 2b. This is one reason.

Another reason relates to the thickness of the n⁻ drain region 1b. Specifically, the n⁻ drain region 1b has the minimum thickness in a part A shown in FIG. 4 because of the existence of the relatively deep second regions 2b. The thinness of the n⁻ drain region 1b means a small resistance in that part. Thus, current is apt to flow most in the part A, so that the flow of the breakdown current $J_C$ concentrates in the semiconductor regions 2b. For the above stated reasons, the flow of the breakdown current $J_C$ concentrates in the second semiconductor regions 2b, so that a voltage drop generated by an internal resistor $R_a$ (see FIG. 3B) becomes less and the parasitic transistor $T_r$ (see FIG. 3B) therefore cannot be easily triggered.

Now, what effect the Patio of the depth $x_1$ of the first semiconductor region 2a to the depth $x_2$ of the second semiconductor region 2b has on the breakdown voltage will be discussed. Such analysis has not been attempted and the value $x_1/x_2$ has generally been determined approximately at 0.5-0.7 with the aim of preventing a trigger of the paratsitic transistor $T_r$ (see FIG. 3B). As a result of a simulation for examining a relationship between the value of $x_1/x_2$ and the breakdown voltage, however, it has been proved that the breakdown voltage reaches the maximum when the value of $x_1/x_2$ is approximately 0.9. A brief outline of the simulation and its results will be described below.

A program for the simulation includes steps of dividing a cell region of the power MOSFET into a mesh, solving the Poisson equation according to data on an impurity distribution and an applied voltage of each mesh element to obtain a distribution of electric field in the cell region and finding an amplification factor of an electron or hole avalanche from the obtained distribution of the electric field to know the breakdown voltage. As the above mentioned data on the impurity distribution, the result of a simulation performed according to the simulation program for evaluating an impurity profile was utilized.

An example of numerical calculation will be described with regard to the power MOSFET of 500V class. In order to attain the breakdown voltage of 550V, for example, the n⁻ drain region 1b must have an impurity concentration $C_B$ of $3.3 \times 10^{14}$ cm⁻³ or below and the thickness of 34 μm or more on the premise that the n⁻ drain region 1b and the p semiconductor region 2 make an ideal plane junction extending infinitely. In many cases, an actual device has a curved interface in its pn junction. Electric field locally concentrates in the curved portion and therefore the breakdown voltage is lower compared with the case of a plane junction. Accordingly, a problem to be solved in a device design is how the breakdown voltage can be approached to that in the case of a plane junction.

In this simulation, an interval B between the adjacent p semiconductor regions 2 is used as a parameter, and the depth $x_2$ is varied under the condition that $x_1 = 4.5$ μm and the width C of the first semiconductor regions 2a is settled at 4.5 μm. Further, the data on the thickness of the n⁻ drain region 1b is settled to 45 μm before the formation of the p semiconductor regions 2, allowing for the thickness being reduced due to the p semiconductor regions 2.

As a result of the simulation in the case of the plane junction, it is proved that the breakdown voltage is 565V when the thickness of the p semiconductor regions 2 is settled to 6 μm. The following Tables 1A to 1E exhibit a simulation breakdown voltage $V_{BR}$ and the ratio of the simulation breakdown voltage $V_{BR}$ to the simulation plane junction breakdown voltage (565V) in the case that the depth $x_2$ is varied. Moreover, the following Table 2 exhibits the ratio of the depth $x_1$ to the depth $x_2$.

TABLE 1A

| B = 1 μm | | | | |
|---|---|---|---|---|
| $x_2$ (μm) | 4.5 | 5.2 | 6.0 | 6.8 |
| $V_{BR}$ (V) | 550 | 530 | 511 | — |
| $V_{BR}/565$ | 0.97 | 0.94 | 0.90 | — |

TABLE 1B

| B = 5 μm | | | | |
|---|---|---|---|---|
| $x_2$ (μm) | 4.5 | 5.2 | 6.0 | 6.8 |
| $V_{BR}$ (V) | 535 | 515 | 499 | 474 |
| $V_{BR}/565$ | 0.95 | 0.91 | 0.88 | 0.84 |

TABLE 1C

| B = 9 μm | | | | |
|---|---|---|---|---|
| $x_2$ (μm) | 4.5 | 5.2 | 6.0 | 6.8 |
| $V_{BR}$ (V) | 515 | 530 | 490 | 460 |
| $V_{BR}/565$ | 0.91 | 0.94 | 0.87 | 0.81 |

TABLE 1D

| B = 13 μm | | | | |
|---|---|---|---|---|
| $x_2$ (μm) | 4.5 | 5.2 | 6.0 | 6.8 |
| $V_{BR}$ (V) | 502 | 518 | 482 | 453 |
| $V_{BR}/565$ | 0.89 | 0.92 | 0.85 | 0.80 |

TABLE 1E

| B = 17 μm | | | | |
|---|---|---|---|---|
| $x_2$ (μm) j | 4.5 | 5.2 | 6.0 | 6.8 |
| $V_{BR}$ (V) | 492 | 508 | 463 | 447 |
| $V_{BR}/565$ | 0.87 | 0.90 | 0.82 | 0.79 |

TABLE 2

| $x_1$ = 4.5 μm | | | | |
|---|---|---|---|---|
| $x_2$ (μm) | 4.5 | 5.2 | 6.0 | 6.8 |
| $x_1/x_2$ | 1 | 0.87 | 0.75 | 0.66 |

Figure 6:
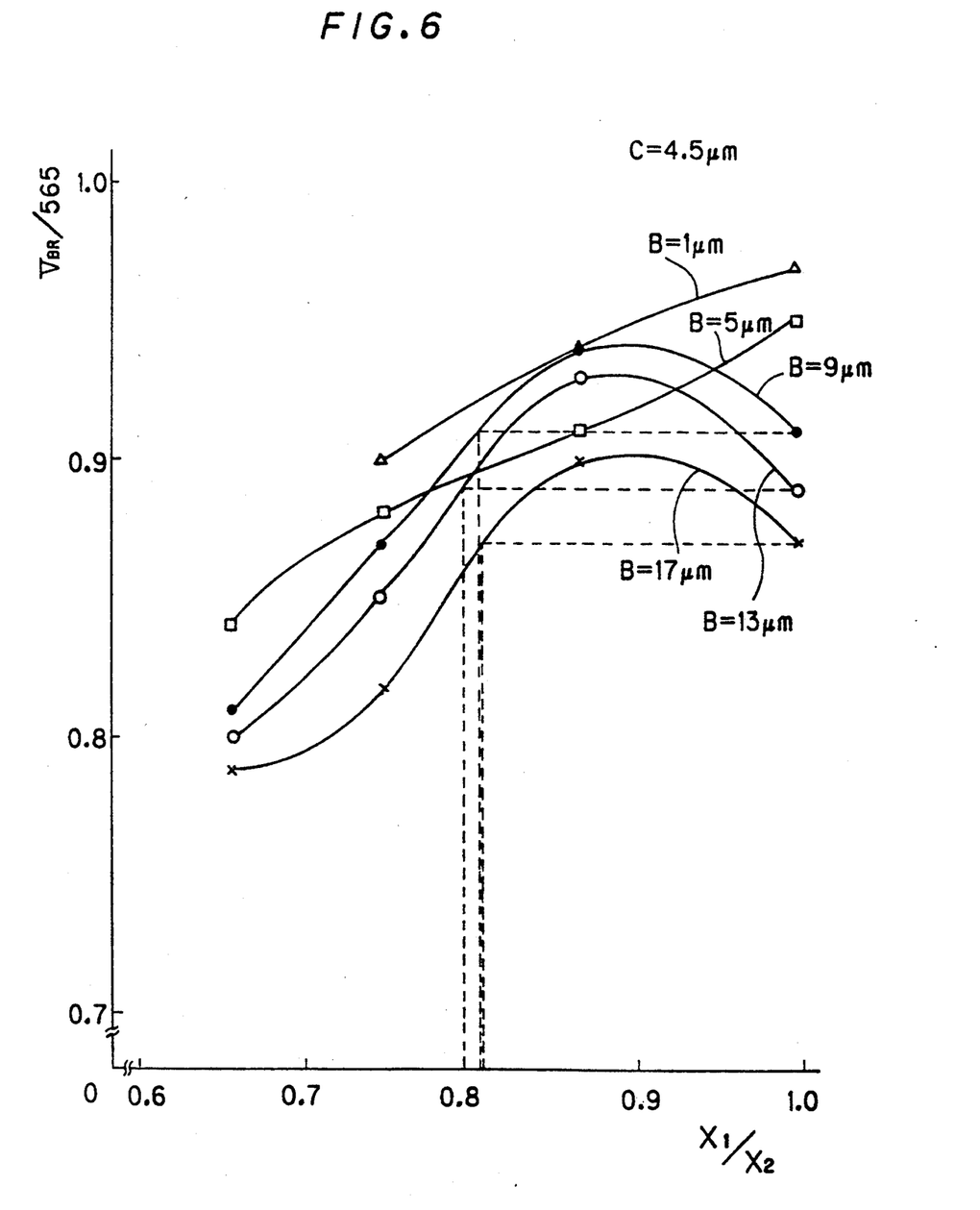
FIGS. 6 to 9 are graphs for explaining an operation of the semiconductor device shown in FIG. 4.

FIG. 6 is a graph illustrating a relationship between $x_1/x_2$ and $V_{BR}/565$ based upon the simulation result of the Tables 1A to 1E. The graph of FIG. 6 should be taken as follows:

(1) In the case that B=9 μm, 13 μm or 17 μm, the simulation breakdown voltage $V_{BR}$ becomes closest to the simulation plane junction breakdown voltage (565V) when the value of $x_1/x_2$ is approximately 0.9. That is, the simulation breakdown voltage $V_{BR}$ reaches the maximum value when $x_1/x_2$ is approximately 0.9. This is because the best connection of the depletion layers between parts I and II in the p semiconductor regions 2 is provided when the value of $x_1/x_2$ is approximately 0.9, so that the concentration of electric field may occur in the least degree.

(2) In the case that B=9 μm, 13 μm or 17 μm, the simulation breakdown voltage $V_{BR}$ is higher than the breakdown voltage in the case that no second semiconductor region 2b is provided (i.e., $x_1/x_2=1$), in an approximate range that $0.81<x_1/x_2<1$.

Table 3 exhibits a relationship between $B/x_1$ and $V_{BR}/565$ when $x_2=5.2$ μm, $x_1/x_2=0.9$ and the width C of the second semiconductor regions 2a is equal to $x_1$.

TABLE 3

| B (μm) | 1 | 5 | 9 | 13 | 17 |
|---|---|---|---|---|---|
| $B/x_1$ | 0.21 | 1.06 | 1.92 | 2.78 | 3.63 |
| $V_{BR}/565$ | 0.94 | 0.91 | 0.94 | 0.92 | 0.90 |

Figure 7:
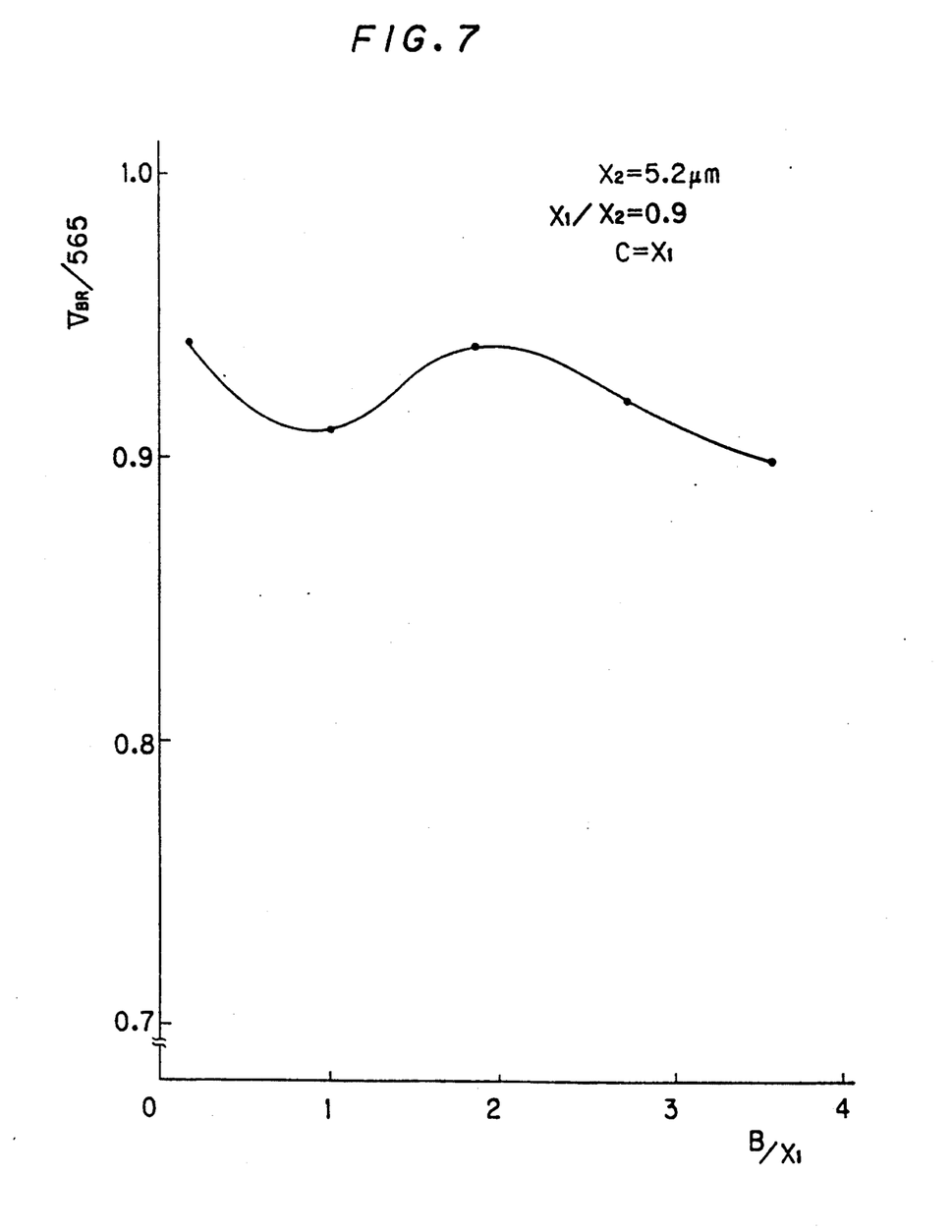

The relation between $B/x_1$ and $V_{BR}/565$ can be represented in a graph as in FIG. 7.

The graph of FIG. 7 should be taken as follows: As the interval B varies, the breakdown voltage also varies. The breakdown voltage reaches the minimum value when $B/x_1 \div 0.7-0.9$ and reaches the maximum value when $B/x_1 \div 2$. In a range that $B/x_1 > 2$, the breakdown voltage decreases gradually and monotonously in accordance with increase of the interval B. With regard to a power MOSFET, ON current flows in the n⁻ drain region 1b between the p semiconductor regions 2, and therefore it is desirable that the interval B is large for reducing ON resistance. Thus, to keep the value of $V_{BR}/565$ large and the reduce ON resistance, there is practically no problem when the value of the interval B satisfies the condition that $B/x_1 > 2$, i.e., $B > x_1 \times 2$.

A power MOSFET was experimentaly manufactured based upon the above described simulation results, and the breakdown voltage therein was measured. The results of the experiment will be described below.

Table 4 exhibits an experimental breakdown voltage $V_{BR}'$ and the ratio of the experimental breakdown voltage $V_{BR}'$ to an experimental plane junction breakdown voltage (525V) in the case that the depth $x_2$ is varied under the condition that $x_1=4.5$ μm, B=10 μm and an impurity concentration $C_B$ in the n⁻ drain region 1b is equal to $3.3 \times 10^{14}$ cm⁻³. Table 5 exhibits values of $x_1/x_2$. The condition in which the experimental plane junction breakdown voltage (525 v) is measured is that the p semiconductor regions 2 are 6 μm in thickness, the n⁻ drain region 1b is 45 μm in thickness and the n⁻ drain region 1b is $3.3 \times 10^{14}$ cm⁻³ in its impurity concentration.

TABLE 4

| $x_2$ (μm) | 4.7 | 5.2 | 6.0 |
|---|---|---|---|
| $V_{BR}'$ (V) | 470 | 490 | 440 |
| $V_{BR}'/525$ | 0.90 | 0.93 | 0.84 |

TABLE 5

| $x_1$ = 4.5 μm | | | |
|---|---|---|---|
| $x_2$ (μm) | 4.7 | 5.2 | 6.0 |
| $x_1/x_2$ | 0.95 | 0.87 | 0.75 |

Figure 8:
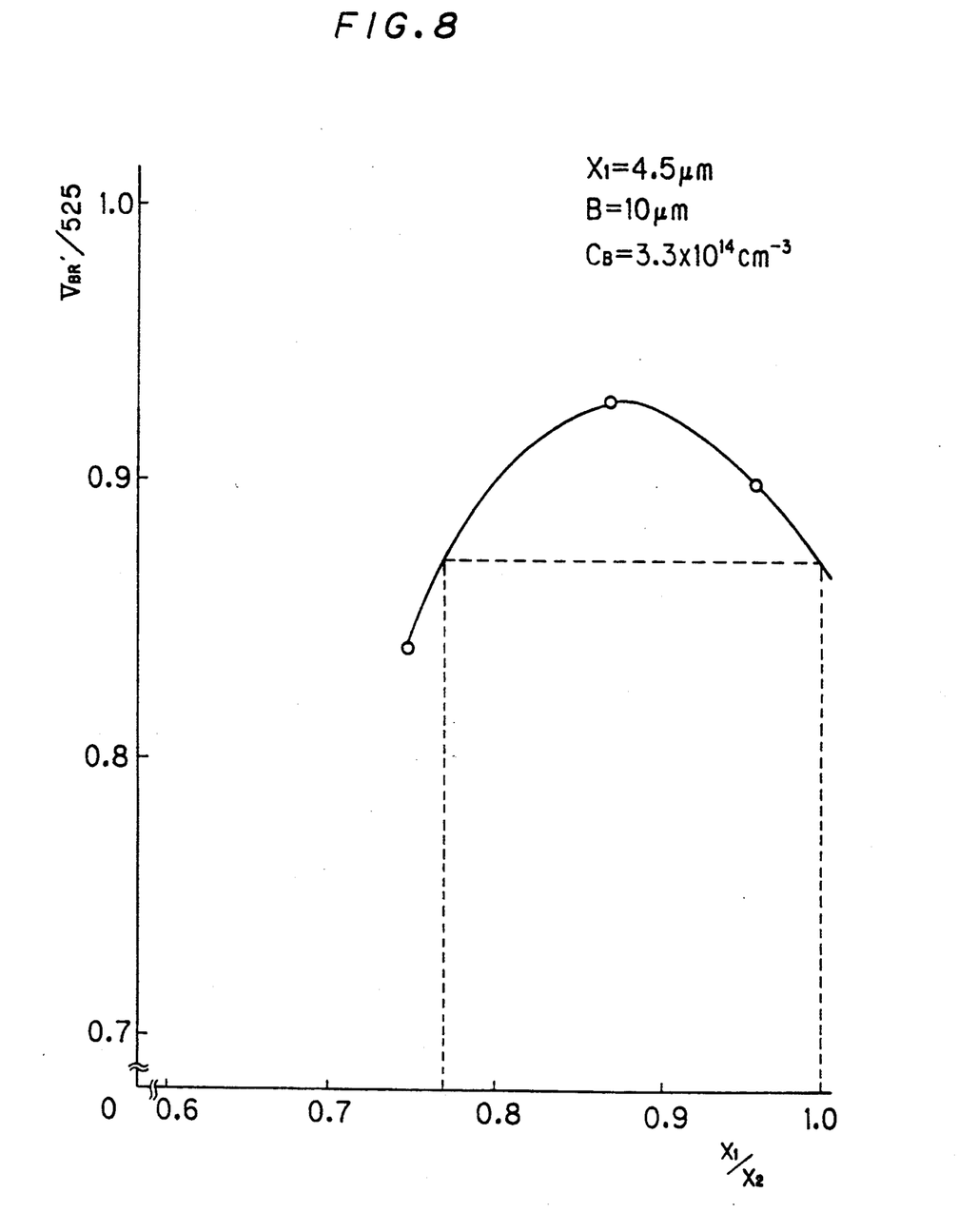

FIG. 8 illustrates the experiment results in a graph by normalizing the results appearing in Table 3. FIG. 8 should be taken as follows:

(3) The experimental breakdown voltage $V_{BR}'$ is made closest to the experimental plane junction breakdown voltage (525V) when the value of $x_1/x_2$ is approximately 0.89. That is, the experimental breakdown voltage $V_{BR}'$ reaches the maximum value when $x_1/x_2$ is approximately 0.89.

(4) The experimental breakdown voltage $V_{BR}'$ is higher than the breakdown voltage in the case that no second semiconductor region 2b is provided (i.e., $x_1/x_2=1$), in a range that $0.78 < x_1/x_2 < 1$.

The above (3) and (4) are almost the same as the aforementioned (1) and (2) given by the simulation results. From these experimental results and simulation results, it should be noted that higher breakdown voltage can be obtained when $0.85 < x_1/x_2 < 0.95$.

Although $x_1 = 4.5$ μm in the above embodiment, $x_1$ may take any value if $x_1/x_2$ is within a range from 0.85 to 0.95.

Figure 9:
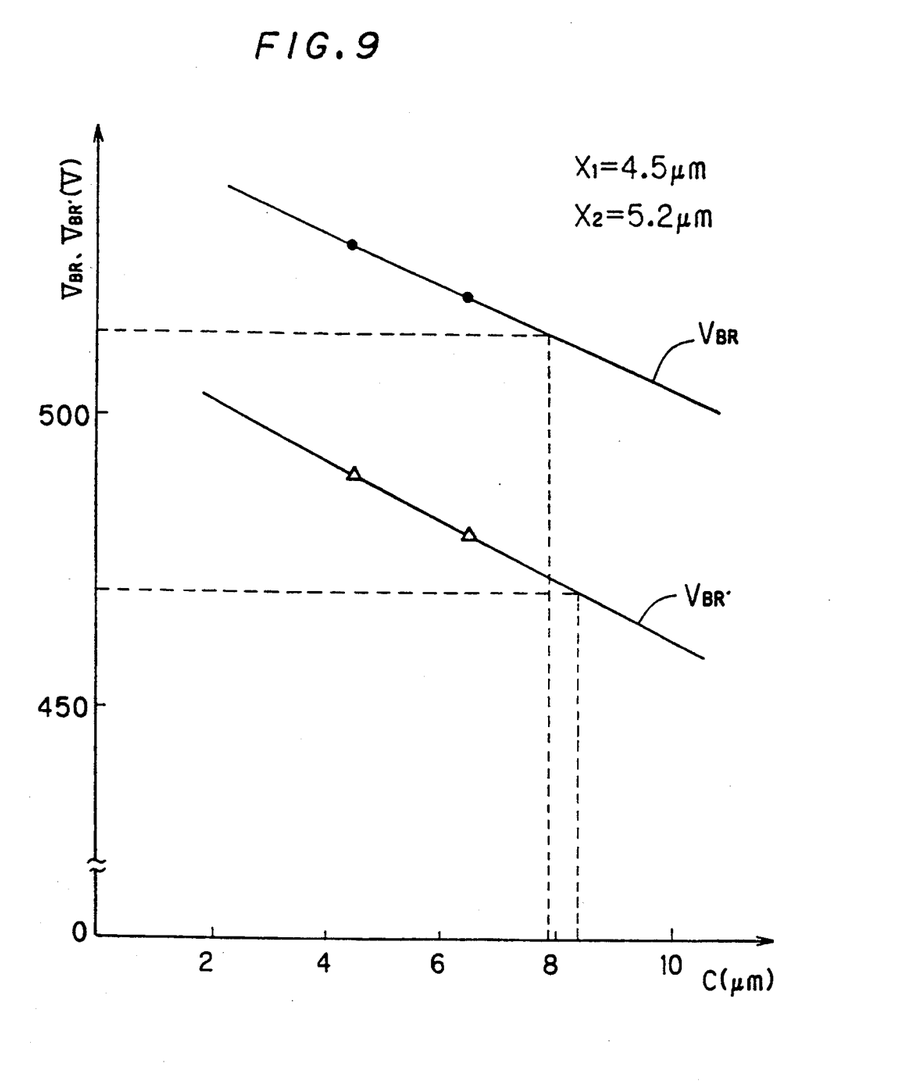

Now, a relationship between the width C of the first semiconductor regions 2a and the breakdown voltage will be described. When the width C is inappropriately large, good connection in the depletion layers between the portions I and II in the p semiconductor regions 2 is not obtained, and therefore a concentration of electric field occurs in this portion and the breakdown voltage goes down. When $C = 6.5$ μm under the condition that $x_1 = 4.5$ μm, $x_2 = 5.2$ μm and $B = 9$ μm, the simulation breakdown voltage $V_{BR}$ was 521V and the experimental breakdown voltage $V_{BR}'$ was 480V. On the other hand, when $C = 4.5$ μm in the same condition, the simulation breakdown voltage $V_{BR}$ was 530V (see Table 1C), and when $C = 4.5$ μm under the condition that $x_1 = 4.5$ μm, $x_2 = 5.2$ μm and $B = 10$ μm (take it $F \approx 9$ μm), the experimental breakdown voltage $V_{BR}'$ is 490V (see Table 4). A relationship between the above mentioned simulation breakdown voltage $V_{BR}$ or experimental breakdown voltage $V_{BR}'$ and the width C is shown in FIG. 9. As can be seen in FIG. 9, both the simulation breakdown voltage $V_{BR}$ and the experimental breakdown voltage $V_{BR}'$ are conjectured to have a linear relationship with the width C. When no second semiconductor region 2b is provided, the simulation breakdown voltage $V_{BR}$ is 515V (see Table 1C) assuming that, for example, $x_1 = x_2 = 4.5$ μm, and then the width C is approximately 7.9 μm as will be recognized from FIG. 9. When $x_1 = 4.5$ μm and $x_2 = 4.7$ μm, which is equivalent to the case that no second semiconductor region 2b is provided, the experimental breakdown voltage $V_{BR}'$ is 470V, and then the width C is approximately 8.4 μm as will be recognized from FIG. 9. Thus, the breakdown voltage becomes larger under the condition that $C \leq 2x_1$, compared with the case that no second semiconductor region 2b is provided. It should be noted that higher breakdown voltage can be obtained compared with the case that no second semiconductor region 2b is provided if the relationship between the breakdown voltage and the width C desirably satisfies $C \leq 1.5x_1$.

Figure 10:
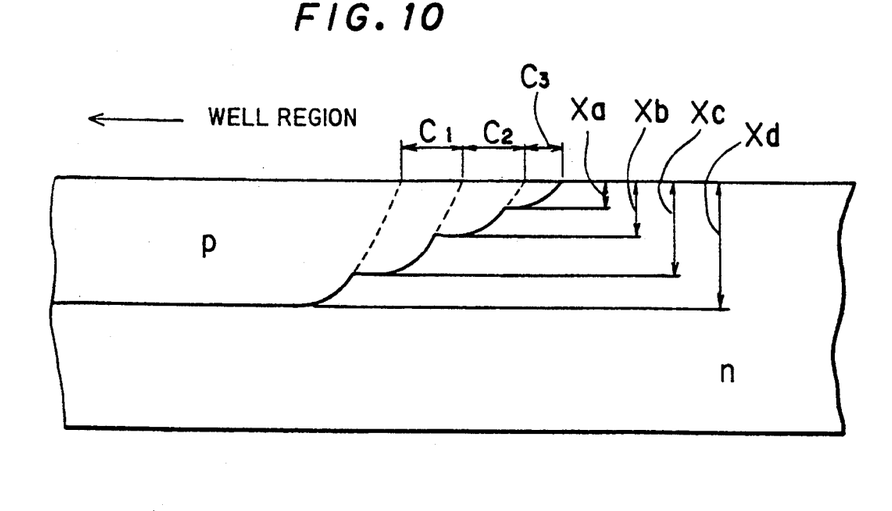
FIG. 10 is a sectional view showing an example of application of the present invention.

In the above embodiment, p semiconductor regions, or a well regions are defined to have two steps in depth. As shown in FIG. 10, however, a p guard ring around a chip in which a p well region is formed may be defined on an n semiconductor layer to have several steps in depth so that the ratio of a depth between adjacent steps (i.e. $x_a/x_b$, $x_b/x_c$, $x_c/x_d$) is settled in a range from 0.85 to 0.95. In this way, concentration of electric field around the chip can be relieved and higher breakdown voltage can be maintained. The concentration of electric field around the chip can be further relieved by satisfying the condition that $C_1 \leq 2x_c$, $C_2 \leq 2x_b$, $C_3 \leq 2x_a$.

Figure 11:
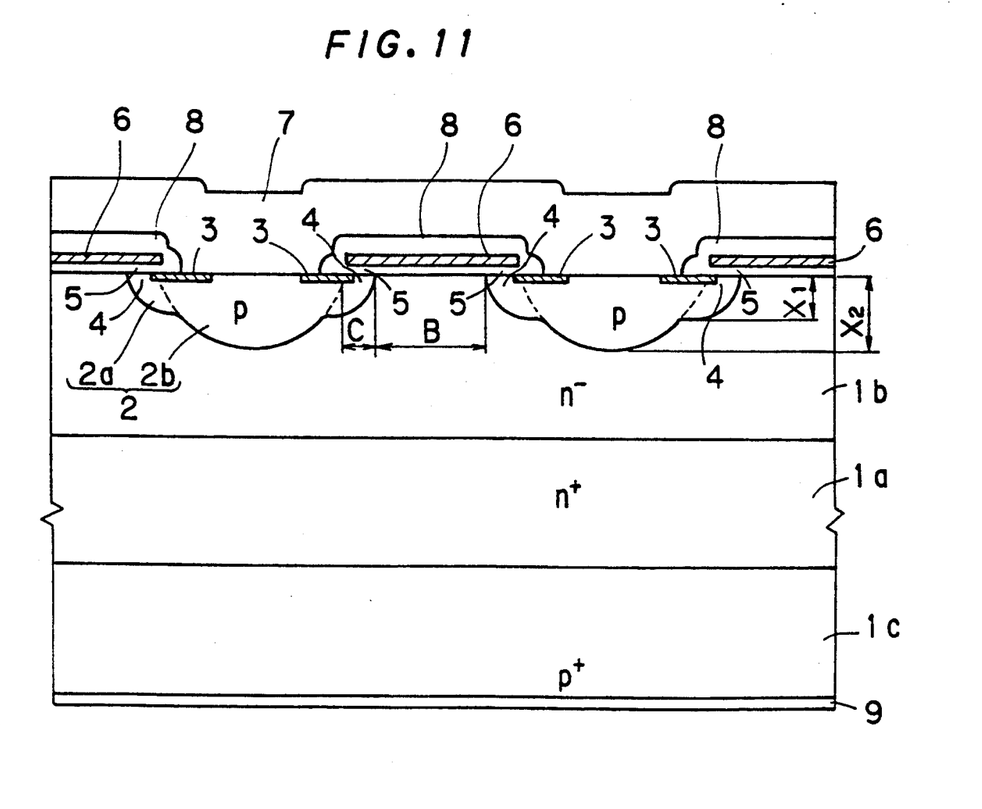
FIG. 11 is a sectional showing another view embodiment of the present invention.

FIG. 11 is a sectional view showing an IGBT to which the present invention is applied. Referring to FIG. 11, there is a structural difference from the power MOSFET shown in FIG. 4, that is, a p+ region 1c is further formed between an electrode 9 and an n+ region 1a. Other parts, that is, the n+ region 1a, an n region 1b, p semiconductor regions 2, n+ regions 3, gate insulation films 5, gate electrodes 6, an electrode 7, layer insulation films 8 and the electrode 9 are the same as in the power MOSFET shown in FIG. 4. Thus, the present invention is applicable to an IGBT structured similarly to the above mentioned power MOSFET. The present invention is applicable to semiconductor devices such as a power MOSFET and an IGBT as well as other semiconductor devices structured similar to those semiconductor devices.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A semiconductor device formed by the process of preparing a first conductivity semiconductor layer having first and second major surfaces, selectively forming a second conductivity well region in said first major surface of said semiconductor layer by double diffusion, selectively forming a first conductivity semiconductor region in a surface of said well region, forming a first main electrode on said semiconductor region, and forming a second main electrode on said second major surface of said semiconductor layer, wherein said step of selectively forming said second conductivity well region includes the step of forming a mask for said double diffusion and said step of forming a mask for said double diffusion includes the steps of forming a patterned insulation layer on said first major surface of said semiconductor layer and forming a patterned control electrode on said insulation layer, comprising:

said first conductivity semiconductor layer having said first and second major surfaces;

said second conductivity well region disposed in a portion of said first major surface of said semiconductor layer, said second conductivity well region having a stepped configuration composed of a peripheral portion having a first depth and a central portion having a second depth, wherein a ratio of said first depth to said second depth is between 0.85 and 0.95; and said first conductivity semiconductor region in a selected region of said surface of said second conductivity well region;

said first main electrode on said semiconductor region; and said second main electrode on said second major surface of said semiconductor layer.

2. A semiconductor device formed by the process of preparing a first conductivity semiconductor layer having first and second major surfaces, selectively forming a second conductivity well region in said first major surface of said semiconductor layer by double diffusion, selectively forming a first conductivity semiconductor region in a surface of said second conductivity well region, forming a first main electrode on said semiconductor region, and forming a second main electrode on said second major surface of said semiconductor layer, wherein said step of selectively forming said second conductivity well region includes the step of forming a mask for said double diffusion and said step of forming a mask for said double diffusion includes the steps of forming a patterned insulation layer on said first major surface of said semiconductor layer and forming a patterned control electrode on said insulation layer, comprising:

said first conductivity semiconductor layer having said first and second major surfaces;

said second conductivity well region disposed in a portion of said first major surface of said semiconductor layer, said second conductivity well region having a stepped configuration and composed of a peripheral portion having a first depth and a central portion having a second depth, wherein a ratio of said first depth to said second depth is between 0.85 and 0.95.

3. A product formed by the process of preparing a first conductivity semiconductor layer having first and second major surfaces;

selectively forming a second conductivity well region in said first major surface of said semiconductor layer by double diffusion, comprising:

said first conductivity semiconductor layer having said second conductivity well region formed in said first major surface, wherein said second conductivity well region has a stepped configuration that is composed of a peripheral portion having a first depth and central portion having a second depth, and wherein a ratio of said first depth to said second depth is between 0.85 and 0.95.

* * * * *